United States Patent
Collin

(10) Patent No.: US 10,379,495 B2
(45) Date of Patent: Aug. 13, 2019

(54) GUN SIGHT WITH BRIGHTNESS CONTROL

(71) Applicant: Ziel Optics, Inc., Ann Arbor, MI (US)

(72) Inventor: Fred Collin, Brighton, MI (US)

(73) Assignee: Ziel Optics, Inc., Ann Arbor, MI (US)

( * ) Notice: Subject to any disclaimer, the term of this patent is extended or adjusted under 35 U.S.C. 154(b) by 301 days.

(21) Appl. No.: 15/446,715

(22) Filed: Mar. 1, 2017

(65) Prior Publication Data

US 2018/0196390 A1    Jul. 12, 2018

Related U.S. Application Data

(60) Provisional application No. 62/445,323, filed on Jan. 12, 2017.

(51) Int. Cl.
| | |
|---|---|
| *F41G 1/30* | (2006.01) |
| *G03H 1/22* | (2006.01) |
| *G02F 1/1335* | (2006.01) |
| *G02B 5/32* | (2006.01) |
| *G03H 1/00* | (2006.01) |
| *H01S 5/062* | (2006.01) |

(52) U.S. Cl.
CPC .............. *G03H 1/2286* (2013.01); *F41G 1/30* (2013.01); *G02B 5/32* (2013.01); *G02F 1/133528* (2013.01); *G03H 1/0005* (2013.01); *H01S 5/062* (2013.01); *G02F 2001/13356* (2013.01); *G02F 2203/48* (2013.01); *G03H 2222/31* (2013.01); *G03H 2222/52* (2013.01); *G03H 2223/24* (2013.01)

(58) Field of Classification Search
CPC ........ G02B 5/32; G02B 27/10; G03H 1/2286; G03H 1/0005; F41G 1/30; H04N 9/3105
See application file for complete search history.

(56) References Cited

U.S. PATENT DOCUMENTS

| | | |
|---|---|---|
| 5,483,362 A | 1/1996 | Tai et al. |
| 5,729,010 A | 3/1998 | Pinkus et al. |
| 7,524,099 B2 | 4/2009 | Moon |
| 9,250,449 B2 | 2/2016 | Xu |
| 9,285,524 B2 | 3/2016 | Park et al. |
| 9,361,856 B2 | 6/2016 | Jiang |
| 2004/0066547 A1* | 4/2004 | Parker ...................... G02B 5/32 359/15 |
| 2008/0094348 A1 | 4/2008 | Yin et al. |

(Continued)

FOREIGN PATENT DOCUMENTS

| | | |
|---|---|---|
| EP | 0451681 A2 | 10/1991 |
| EP | 0664495 A1 | 7/1995 |
| WO | 9724645 A1 | 7/1997 |

*Primary Examiner* — Thanh Nhan P Nguyen
(74) *Attorney, Agent, or Firm* — Dinsmore & Shohl LLP

(57) ABSTRACT

A holographic weapon sight has a housing with a viewing end and an opposing target end, a viewing path being defined from the viewing end to the target end. A light source energized by a power source projects a light beam along a path onto a liquid crystal cell module. A power controller in communication with the power source is operable to adjust the brightness of the light beam from the light source. The liquid crystal cell module is operable to rotate and polarize the light beam to further adjust the brightness of the light beam. The light beam from the liquid crystal cell module illuminates a holographic optical element (HOE) that reconstructs an image of a reticle.

14 Claims, 7 Drawing Sheets

(56) References Cited

U.S. PATENT DOCUMENTS

2008/0291378 A1   11/2008  Sasaki
2009/0046222 A1    2/2009  Miner et al.
2016/0165104 A1    6/2016  Gobeli
2016/0377378 A1   12/2016  Collin

* cited by examiner

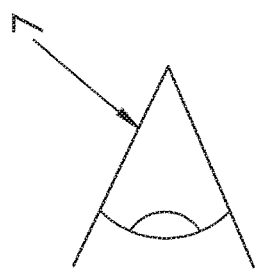
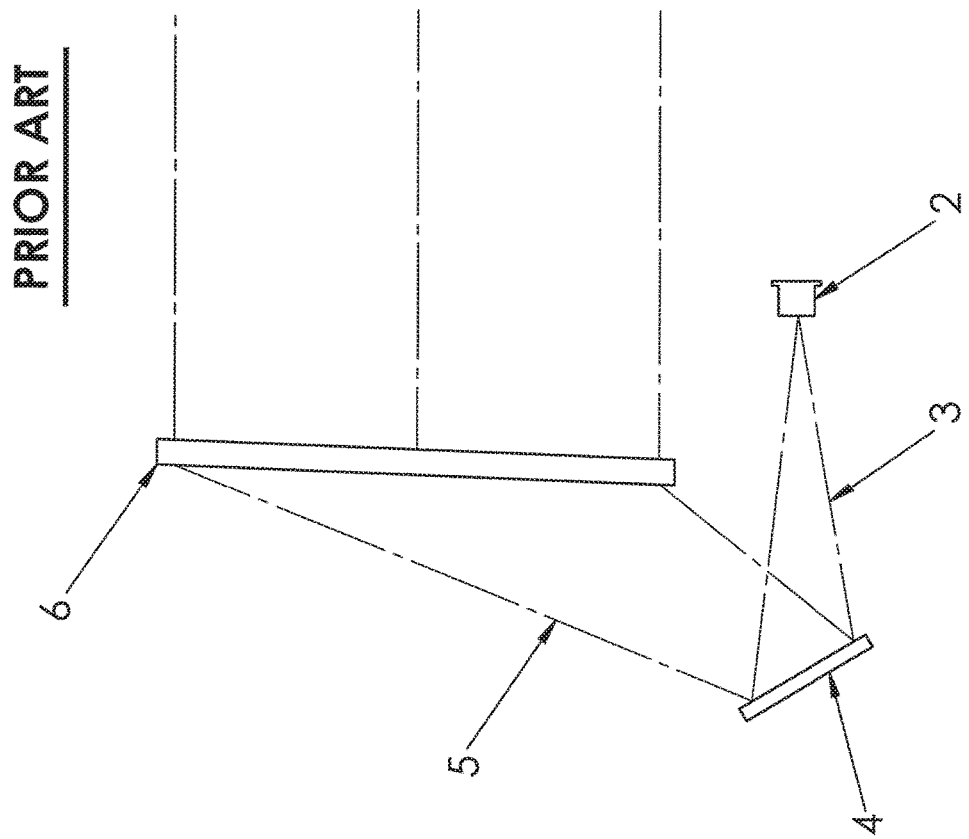
FIG. 1
PRIOR ART

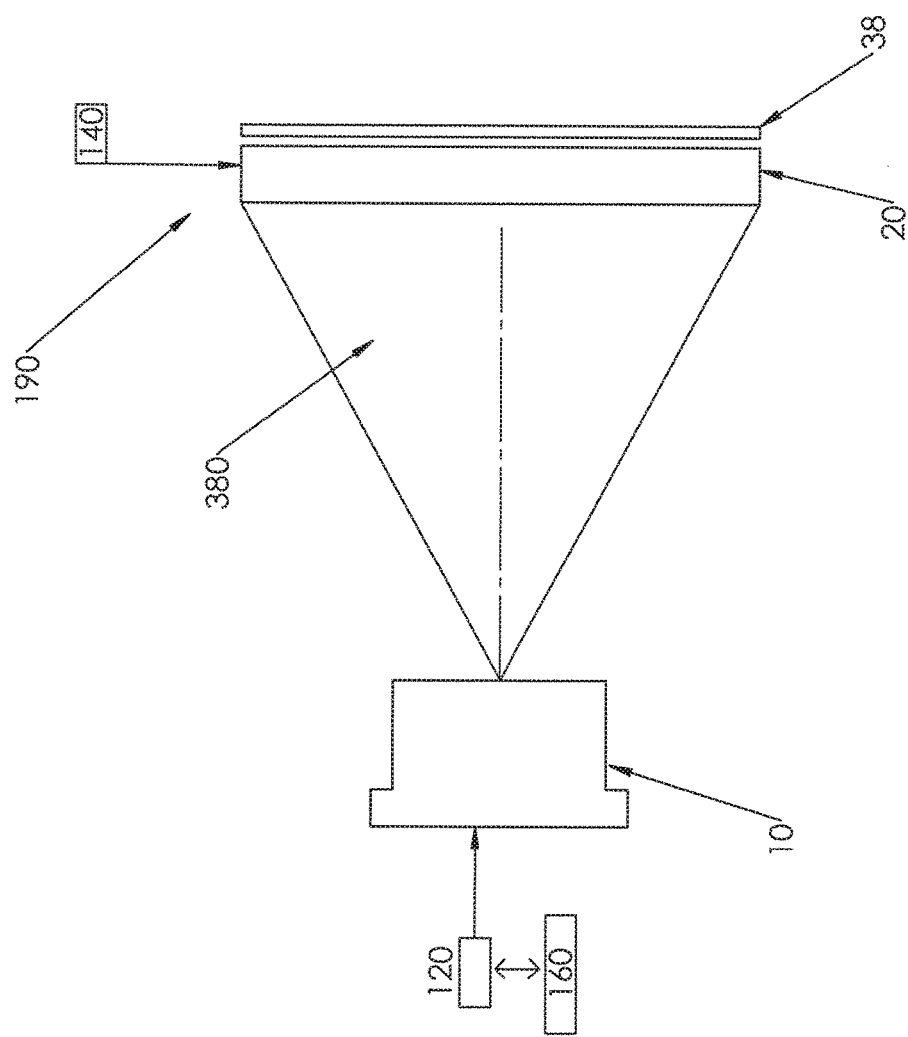

GUN SIGHT WITH BRIGHTNESS CONTROL

CROSS-REFERENCE TO RELATED APPLICATION

This Application claims the benefit of U.S. Provisional Application 62/445,323 filed on Jan. 12, 2017.

FIELD OF THE INVENTION

This application relates generally to compact holographic gun sights that generate a reticle for aiming weapons or other optical devices.

BACKGROUND OF THE INVENTION

There are several types of sights available in the market to enable a user of a weapon such as rifle, shotgun, handgun, and submachine gun to aim these weapons. Examples of such sighting devises include laser sights, holographic sights, and "reflex" or "red dot" sights. Holographic sights utilize a holographic optical element (HOE), illuminated by a reconstruction beam, and the HOE reconstructs an image, typically of a reticle. A user looks through the HOE at a targeted object and perceives the reconstructed reticle.

FIG. 1 schematically illustrates an example of such a prior art device. A light source 2, typically a laser diode, projects a diverging beam of light 3 that is reflected by a mirror 4 or HOE, such as a grating, creating a reflected beam 5. The reflected beam 5 in this example is also diverging, and may be considered a reconstruction beam. Alternatively, the beam may be collimated. The reconstruction beam 5 illuminates a holographic optical element (HOE) 6 and the HOE 6 reconstructs an image of a reticle. An individual's eye 7 can view the image of the reticle and a target (not shown) through the HOE 6. These reticles may be illuminated for use on low-light or daytime conditions. With any illuminated low-light reticle, it is generally desirable that its brightness can be adjusted. A reticle that is too bright may cause glare in the user's eye, interfering with his ability to see in low-light conditions. This may be because the pupil of the human eye closes quickly upon receiving any source of light.

FIG. 2 schematically illustrates an example of a prior art device with a configuration that uses collimated light. A light source 10, typically a laser diode, projects a diverging beam of light 11, which passes through a collimating lens 12. This creates a collimated beam of light 13. The collimated beam 13 illuminates a diffraction grating 14. The diffraction grating 14 produces a reconstruction beam 15 that is angled upwardly, in this example, which illuminates an HOE 16. The HOE reconstructs an object beam 17 that is perceived by a user's eye 18. The object beam 17 is angled downwardly, in this example, such that the object beam 17 and the collimated beam 13 are parallel to each other. The grating 14 and HOE 16 are also parallel to each other.

SUMMARY OF THE INVENTION

Certain embodiments of the present invention provide a holographic gun sight with a housing having a viewing end and an opposing target end, wherein a viewing path is defined from the viewing end to the target end. The holographic gun sight may have a laser diode operable to project a light beam along a path when energized, a power source operable to energize the laser diode, and a power controller in communication with the power source, wherein the power controller may be operable to control an output of the power source to selectively adjust a brightness of the light beam projected by the laser diode.

The holographic gun sight may also have a liquid crystal cell module at least partially disposed in the light path and operable to selectively attenuate the light beam to adjust the brightness of the light beam passing therethrough. The liquid crystal cell module may comprise a liquid crystal controller, a liquid crystal cell, and a polarizer. The liquid crystal controller may be operable to communicate with the liquid crystal cell. The liquid crystal cell is disposed in the path of the light beam such that the light beam from the laser diode illuminates the liquid crystal cell. The liquid crystal cell is operable to selectively rotate the light beam at an angle as the light beam passes therethrough. The polarizer is disposed in the path of the beam of light after the liquid crystal cell such that the polarizer is illuminated by the light beam after it passes through the liquid crystal cell, the polarizer polarizing the light beam.

A holographic optical element (HOE) is illuminated by the polarized light beam after the liquid crystal cell module, the HOE reconstructing the light beam as an image of a reticle.

The power controller and the liquid crystal controller cooperate to selectively control the brightness of the light beam illuminating the HOE, thereby adjusting a brightness of the image of the reticle viewed by the user.

In certain embodiments, no polarizer is disposed between the laser diode and the liquid crystal cell. Alternative, the liquid crystal cell module may further comprise an additional polarizer disposed in the light path between the laser diode and the liquid crystal cell. The polarizer and additional polarizer may each be adjacent to the liquid crystal cell such that the liquid crystal cell is sandwiched between the polarizers. The polarizer and additional polarizer may each have a polarization axis with the axes being generally aligned.

In certain embodiments, a third polarizer is disposed in the path of the light beam.

In some embodiments, the laser diode is a vertical-cavity surface-emitting laser diode (VCSEL).

In some examples, the power controller controls the power source such that the output of the power source is a pulse width modulated signal, the power controller varying a pulse width and/or a pulse frequency of the pulse width modulated signal output by the power source and energizing the laser diode. The pulse frequency may be greater than or equal to 70 Hz In certain embodiments, the light beam illuminating the HOE is a non-collimated diverging beam of light.

In some alternatives, the HOE is disposed in the viewing path such that a user views the image of the reticle through the HOE when viewing a target along the viewing path. The sight may further include at least one non-diffraction element (NDE). In some alternatives, the NDE is disposed in the viewing path and reflects an image of a reticle from the HOE, and the HOE not disposed in the viewing path.

A method for adjusting a brightness of an image of a reticle of a holographic weapon sight, in accordance with a further aspect of the present invention, provides a weapon sight according to any embodiment herein. The method includes the steps of energizing the laser diode with the power source to project a light beam, controlling the output of the power source using the power controller to adjust the brightness of the light beam, and attenuating the light beam by using the liquid crystal cell module. The attenuating step includes projecting the light beam on the liquid crystal cell and using the liquid crystal controller to selectively rotate the light beam at an angle and projecting the light beam from the liquid crystal cell onto the polarizer and polarizing the light beam when the light beam is passing through the polarizer in order to adjust the brightness of the light beam. The method further includes the steps of illuminating the HOE with the light beam from the polarizer, the HOE reconstructing the light beam as an image of a reticle, and cooperatively controlling the power controller and the liquid crystal controller to control the brightness of the light beam thereby adjusting the brightness of the image of the reticle.

BRIEF DESCRIPTION OF THE DRAWINGS

The accompanying drawings, which are included to provide a further understanding of the invention, and are incorporated in and constitute a part of this application, illustrate embodiment (s) of the invention and together with the description serve to explain the principle of the invention. In the drawings:

FIG. 1 is a light path diagram of an example of a prior art sighting device;

FIG. 3B is a schematic illustrating a portion of another embodiment of the present invention;

DETAILED DESCRIPTION OF THE INVENTION

The present invention provides embodiments of a gun sight with brightness control. Such a gun sight may take a variety of forms. Certain examples of the present invention are shown in the figures. However, the present invention is not limited to the illustrated embodiments. Additional advantages, objects, and features of the invention will be set forth in part in the description that follows and in part will become apparent to those having ordinary skill in the art upon examination of the following or may be learned from practice of the invention.

Figure 2:
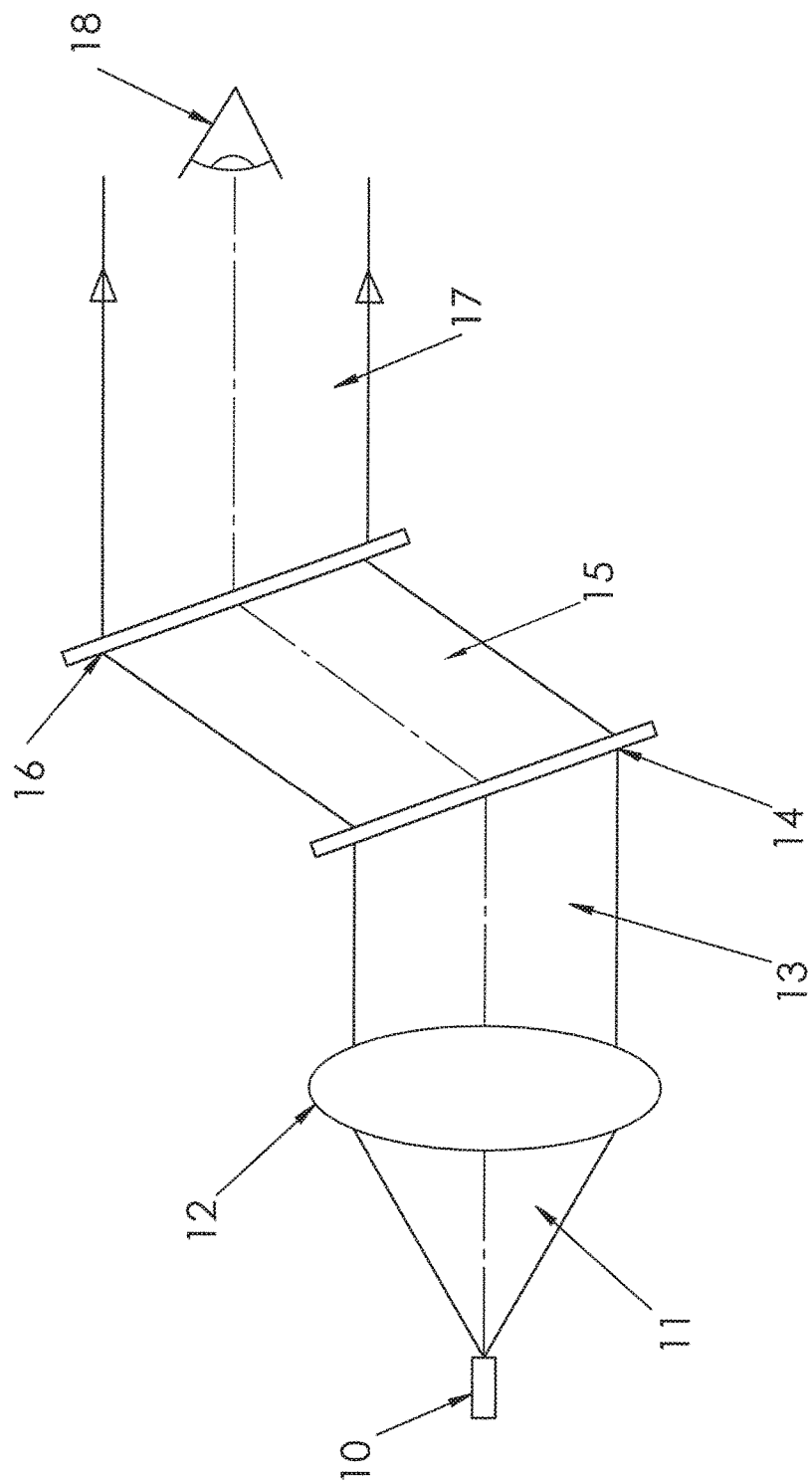
FIG. 2 is a light path diagram of another example of a prior art sighting device.
Figure 3A:
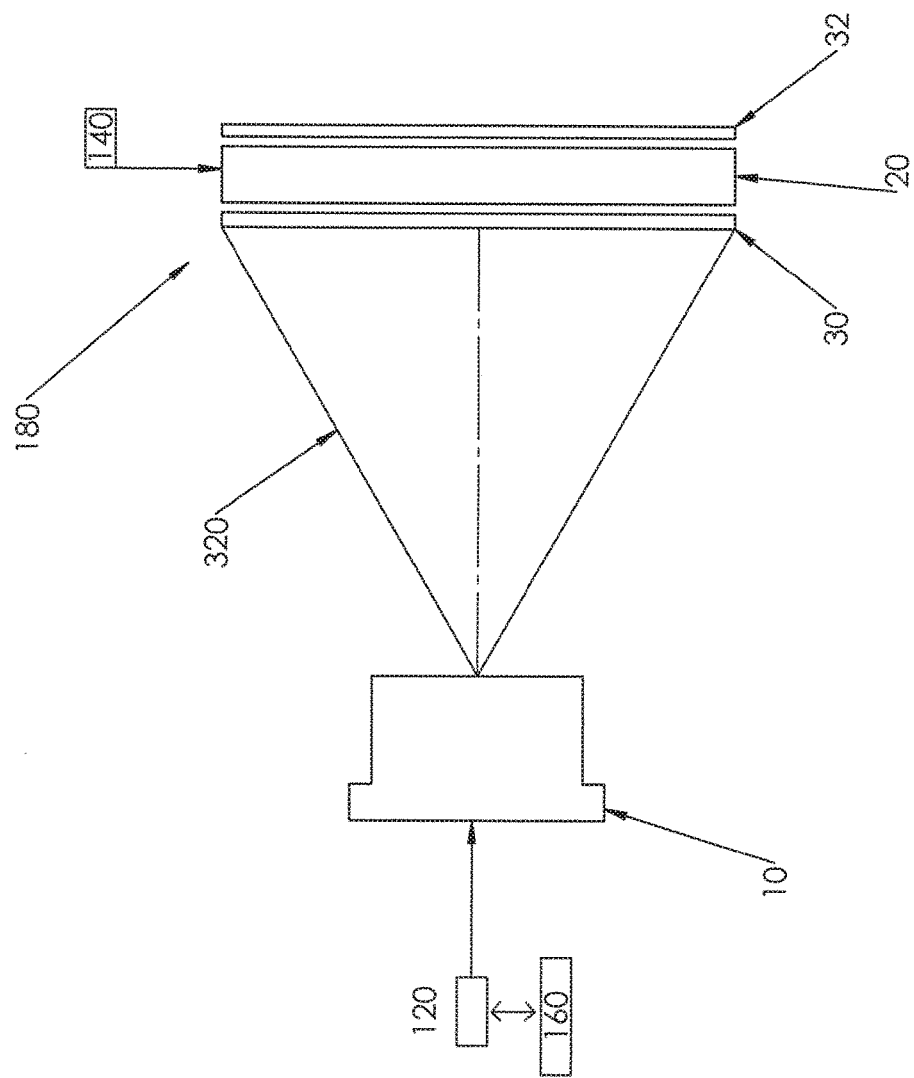
FIG. 3A is a schematic illustrating a portion of an exemplary embodiment of the present invention.

Brightness requirements for a holographic gun sights are generally based on a user's input and are quantitative. Various conditions, such as the time of day/night, cloud coverage, fog, ambient lighting etc., may necessitate adjustment of the brightness of the reticle. It is desirable that the brightness adjustment may be achieved across a wide range. FIG. 3A is a schematic illustrating a portion of an exemplary embodiment of the present invention that may facilitate brightness adjustment of a reticle across a wide range. In this embodiment, a light source 10 may be energized by a power source 120. In certain embodiments, the light source 10 is a laser diode such as a vertical-cavity surface-emitting laser diode (VCSEL), though other light sources may be used.

When energized by the power source 120, the light source 10 projects a light beam 320 along a path. In some embodiments, the light beam is a non-collimated diverging beam of light. Alternatively, additional optical elements may be provided to collimate the beam of light. Some embodiments may have a power controller 160 that is in communication with the power source 120. Power controller 160 is operable to control an output of the power source 120 to selectively energize the laser diode 10. The power controller 160 may be integrated with the power source. The brightness of the light beam 320 may be altered to a certain extent using the power controller. For example, the laser diode may be driven with a pulse width modulated (PWM) signal. By varying the frequency of the pulses and the pulse duration, the apparent brightness of the beam maybe adjusted. The drive current may also be adjusted, but varying current may alter the output wavelength. There are practical limits to the range of brightness control using the power controller. If the pulses are too far apart and/or the frequency of the pulses is too low, a hologram reconstructed using the beam of light may appear to flicker. In some embodiments according to the present invention, the output of the power source 120 may have a frequency of greater than or equal to 70 Hz and/or a frequency in the range of 79 Hz to 111 Hz. In some examples, the practical range of brightness control may be approximately 740:1. Other ranges may correspond to other examples, but typically the range is not great enough to accomplish a desired total adjustment range.

Referring again to FIG. 3A, light beam 320 is projected on a liquid crystal cell module 180 that attenuates light beam 320 to further adjust the brightness of the light beam 320. Liquid crystal cell module 180 includes a first polarizing film/polarizer 30 and a second polarizing film/polarizer 32, a liquid crystal cell 20 and liquid crystal controller 140, wherein the liquid crystal controller 140 is in communication with liquid crystal cell 20.

The first polarizer 30 and second polarizer 32 may each be linear polarizers having a polarization axis. In some embodiments, first polarizer 30 or second polarizer 32 have polarization axes that are generally aligned with one another. For example, each may have a horizontal polarization axis or each have a vertical polarization axis.

Unpolarized light can be considered a rapidly varying random combination of p- and s-polarized light. P-polarized (from the German parallel) light has an electric field polarized to a plane of incidence, while s-polarized (from the German senkrecht) light is perpendicular to this plane. In other words, p- and s- are linear polarizations defined by their relative orientation to the plane of incidence. An ideal linear polarizer will only transmit one of the two linear polarizations, reducing the initial intensity $I_o$ of unpolarized light by half i.e.

$$I = \frac{I_0}{2}.$$

For linearly polarized light with intensity $I_o$, the intensity transmitted through an ideal polarizer, I, can be described by Malus' law $I=I_o\cos^2\theta$. Where $\theta$ is the angle between the incident linear polarization and the polarization axis. In simpler terms, the amount of light that passes through a linear polarizer with a particular polarization axis will depend on how much of the light is generally aligned with that polarization axis. If p-polarized light illuminates a linear polarizer having a p-axis, much of the light will pass through. There will be some losses due to light scattering and other optical effects. If, on the other hand, p-polarized light illuminates a linear polarizer having an s-axis, most of the light will be blocked. Different polarizers have different efficiencies, so the extent to which light is passed or blocked will vary somewhat, but typically a polarizer will pass at least 80-90% of light that is aligned with its polarization axis and will block 80-90% or more of light that has an axis at 90 degrees to the polarization axis. Natural light or partially polarized light will have a mix of angles and the amount of light passing through a polarizer will depend on the portion aligned with the polarization axis, in accordance with Malus's law, mentioned above.

As known to those of skill in the art, a laser diode may produce partially polarized light, including a mix of p- and s-polarized light. In a non-limiting embodiment, a light source (e.g. VCSEL) may project a light beam with 5 parts p- and 1 part s-polarized light. In other embodiments, a light source (e.g. VCSEL) may project 1500 parts p- and 1 part s-polarized light. In each example, the reference to p- and s-polarized light is somewhat arbitrary, since it references a plane of incidence, and the polarization angles may be adjusted by rotating the laser diode.

Referring again to FIG. 3A, the intensity of light beam 320 will be reduced somewhat as it passes through polarizer 30. How much light that passes through the polarizer 30 will depend on the alignment between the laser diode and the polarizer. In an example in which the VCSEL produces light with a 5:1 polarization ratio, the VCSEL and the polarizer may be aligned such that 1 in 6 parts of the light passes, such that 5 in 6 parts passes, or anywhere in between. The alignment may be adjusted by adjusting the relative rotational positions of the laser diode and the polarizer. In certain examples, the rotational position of the laser diode is set such that the light passed by the first polarizer is generally maximized.

Liquid crystal cell 20 is sandwiched between first polarizer 30 and second polarizer 32. When light beam 320 is projected on first polarizer 30, the light beam is polarized, as discussed above. In one example, light beam 320 has 5 parts p- with 1 part s-polarized light and first polarizer 30 transmits p- but rejects/reflects s-polarized light. Consequently, the p-component of light beam 320 will be transmitted and the s-component will be reflected from the surface of first polarizer 30, reducing the intensity/brightness of light beam 320 by approximately ⅙th. As will be clear to those of skill in the art, if light beam 320 has a different mix of p- and s-polarized light, the amount of light passed will change.

The function of the liquid crystal cell will now be described. The liquid crystal cell may be a liquid crystal shutter with alternating areas where domains or "stripes" are formed by changing the direction of orientation of the liquid crystal fluid. The liquid crystal shutter or cell may rotate the incoming light waves by a rotation angle in the range of approximately 0 degrees to approximately 90 degrees, depending on the setting of the liquid crystal controller. With the liquid crystal cell "off", the incoming light is generally not rotated. As such, the light retains the polarization axis at which it entered. With the liquid crystal cell at a maximum setting, the incoming light will be rotated by close to 90 degrees, thereby changing p-polarized light into s-polarized light or vice versa. If the liquid crystal cell is set somewhere between the maximum and minimum setting, the light will be rotated by a rotation angle between 0 and 90 degrees, depending on the particular setting.

Figure 4:
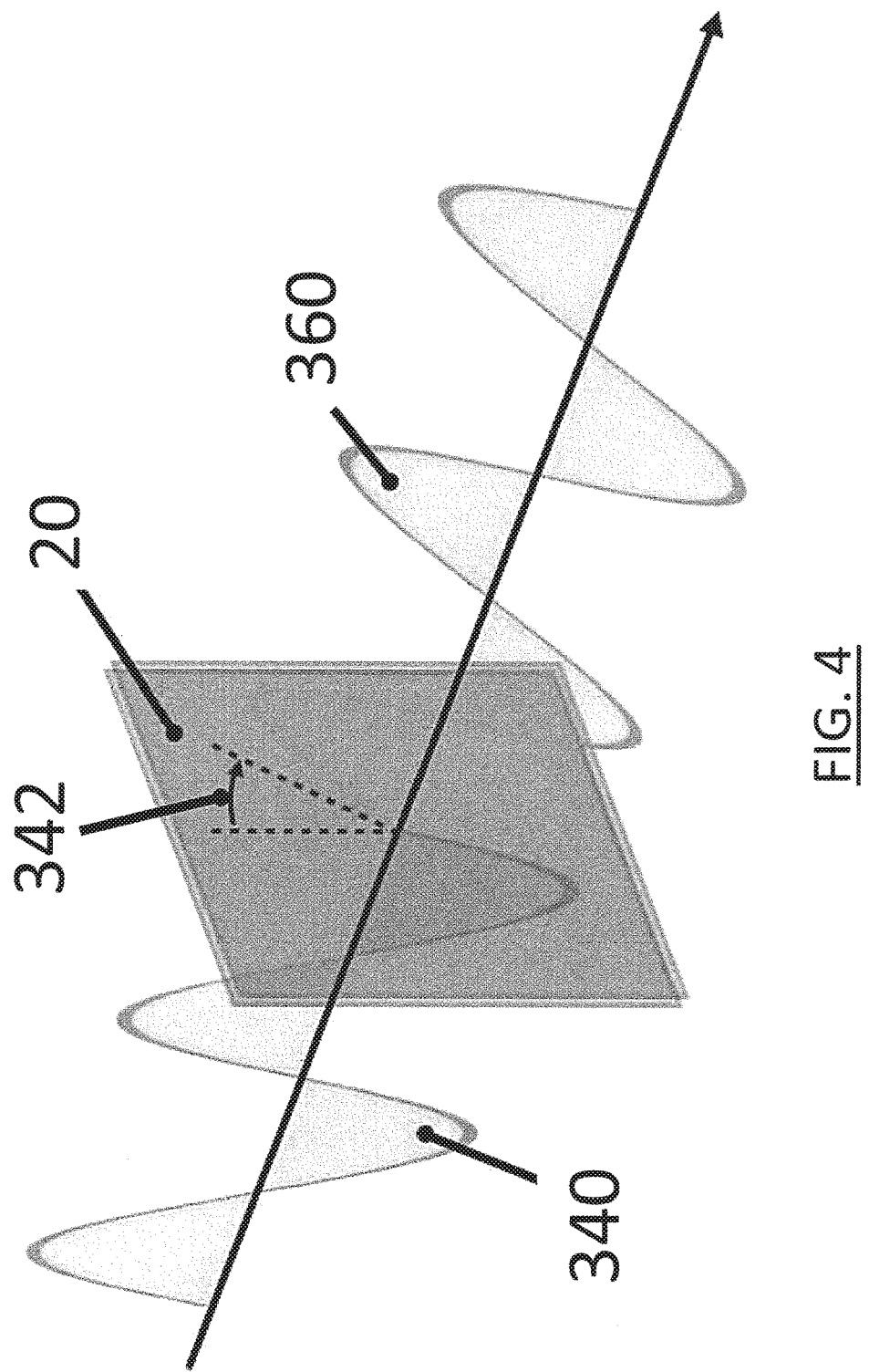
FIG. 4 is a light path diagram of polarized light passing and being rotated through a liquid crystal cell.

FIG. 4 is a light path diagram illustrating a polarized light beam 340 passing through the liquid crystal cell 20. Light beam 340, in this example, has been polarized with a vertical polarization axis. As shown, the light 340 is rotated by an angle of rotation 342, thereby creating light beam 360 with a rotated polarization axis. In some embodiments, liquid crystal controller 140 applies a voltage to liquid crystal cell 20 to rotate the light beam at the angle, although other methods of rotation may also be used. The rotation of the light beam consequently provides light beam 360 with a p- and an s-component, as discussed above. The amount of each component will depend on how much the light beam is rotated.

Referring again to FIG. 3A, the polarizer 32 at the "exit" side of the liquid crystal cell 20 will then pass light that aligns with its polarization axis. Polarized light that is rotated at an angle to the polarization axis of the polarizer will be partially passed, with the amount passed being in accordance with Malus' law. Put another way, and as a non-limiting example, polarized light that is rotated at 45 degrees to the p- or s-axis will act like a mix of p- and s-axis light and, in accordance with Malus' law, 50% of the light will be passed (assuming no losses to other optical effects and a "perfect" polarizer). As such, by adjusting the rotation angle of the liquid crystal cell, the amount of light passing out of the "exit" polarizer may be adjusted over a broad range. In one example, the brightness adjustment range attributable to the liquid crystal cell 20 and "exit" polarizer is approximately 75:1. In some embodiments, the polarization axis of the first polarizer 30 and the second polarizer 32 are aligned. As such, if the liquid crystal is "off" and does not rotate the light coming from the first polarizer 30, most of the light exiting the liquid crystal will pass through the second polarizer 32. Therefore, there is very little attenuation of the light beam 320, other than the reduction due to the polarization by the first polarizer 30 (for example, ⅙$^{th}$ of the light is rejected). In reality, there are some optical losses through the liquid crystal and second polarizer, due to scattering and other effects. In some examples, 80-90% or more of the light is passed with the liquid crystal in the off position. The liquid crystal cell module 180, including the liquid crystal cell 20 and polarizers 20 and 32, may act like a variable shutter that transmits and/or blocks part of the incident light going through it.

As will be clear to those of skill in the art, the polarization axes of the first polarizer 30 and second polarizer 32 alternatively may be set at an angle to each other. If they are set at 90 degrees to each other, and the liquid crystal is off (i.e. no rotation), most of the light would be blocked. Alternatively, if they are set at a small angle with respect to each other, there would be a small attenuation with the liquid crystal off but the attenuation would be reduced if the liquid crystal rotates the light by the same small angle, such that the light exiting the liquid crystal is aligned with the second polarizer.

Referring now to FIG. 3B, an alternative embodiment of a brightness adjustment system will be described. In this embodiment, liquid crystal cell module 190 has a liquid crystal cell 20, a liquid crystal controller 140, and a single "exit" polarizer 38. The light source 10 projects a light beam 380 onto the liquid crystal cell 20 without a polarizer between the light source and liquid crystal cell. As discussed above, a laser diode may provide light that is at least partially polarized, having a majority of its light polarized along one axis. If the liquid crystal cell is off, this partially polarized light will not be rotated and will illuminate the polarizer 38 having its original orientation and most of its initial brightness. There will be some optical losses through the liquid crystal cell, but the elimination of the first polarizer, in the input side of the liquid crystal cell may cause more intensity to be retained. If the polarization axis of the "exit" polarizer 38 is aligned with the axis of the majority of the light from the laser diode, most of the light will pass through the polarizer 38. Using the earlier example, in which the laser diode has 5 parts of one polarization to one part of a perpendicular polarization, approximately 1/6th of the light will be rejected. As with the earlier embodiment, the liquid crystal cell may rotate the incoming light at an angle and this will have the effect of reducing the amount of light that will pass through the polarizer 38. One difference is that setting the liquid crystal cell at a maximum setting, wherein the light is rotated close to 90 degrees, may not result in blocking as much light, since the rotated light will still have a mix of polarizations and some of the minor component will no align with the polarization axis of the polarizer 38. Power controller 160 is in communication with power source 120 and is operable to control an output of power source 120 to adjust a brightness of light beam 380, as discussed above.

In a non-limiting example, some embodiments may further have an additional, such as a third, polarizer (not shown), that is disposed in the path of the light beam. The third polarizer (not shown) may be disposed before or after liquid crystal cell module in the path of the light beam.

Figure 5:
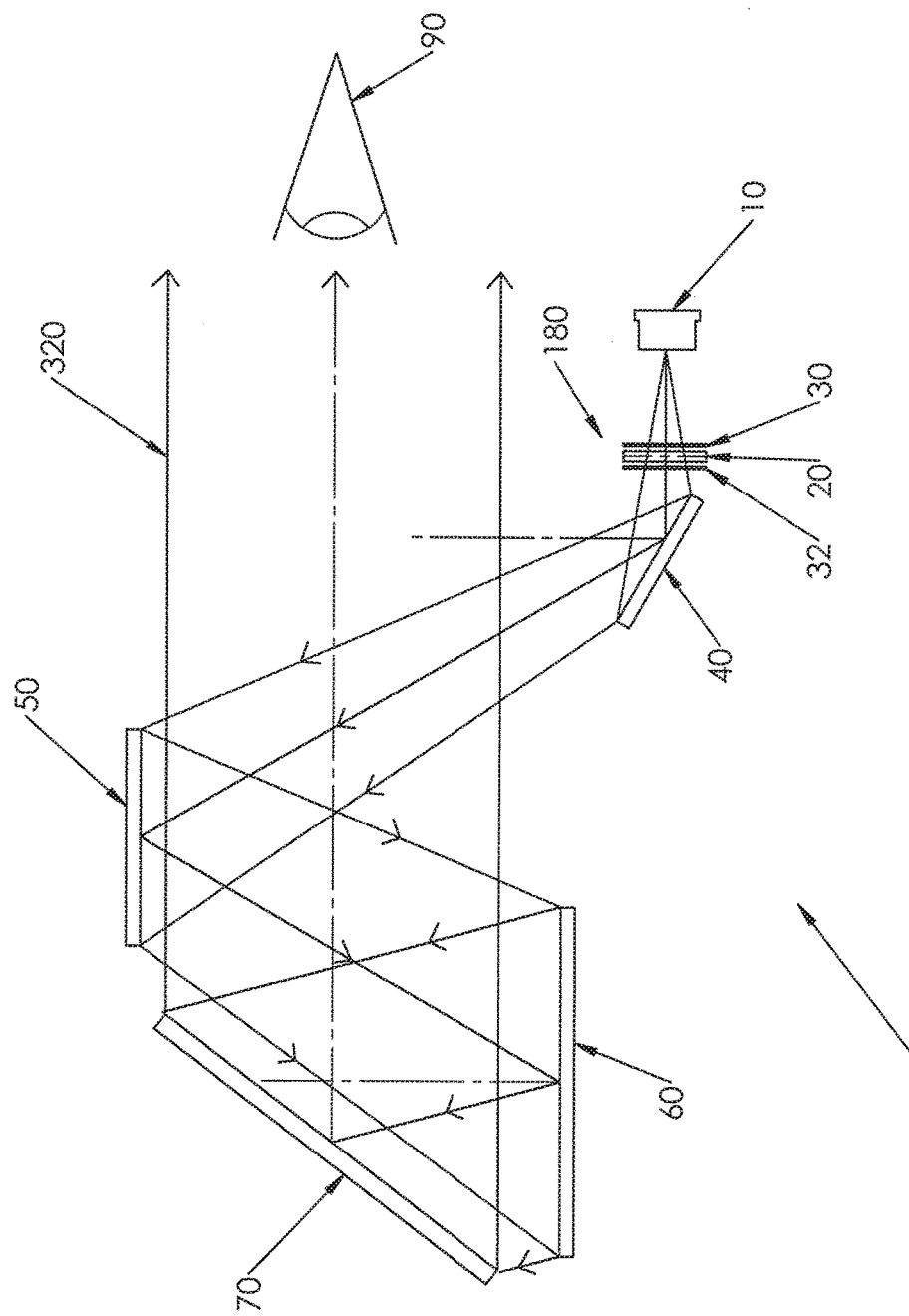
FIG. 5 is a light path diagram for an embodiment of the present invention.

FIG. 5 is a light path diagram for an embodiment according to the present invention. FIG. 5 provides an arrangement for a user 90 to view a reticle through an optical element 70 that may be a holographic optical element (HOE). As used herein, a holographic optical element (HOE) is defined as an optical element (such as a lens, filter, beam splitter, or diffraction grating) that is produced using holographic imaging processes or principles. In this embodiment, the HOE reconstructs a reticle for aiming a weapon. The light beam generated by laser diode 10 is attenuated by liquid crystal cell module 180 and is projected toward mirror 40. The light beam illuminates mirror 40, which reflects the light beam toward other optical elements such as mirror 50 and/or 60. In some embodiments, other optical elements may be used instead of mirrors, e.g. diffraction gratings. The light beam is then reflected onto the HOE 70 which reconstructs the image of the reticle, which may be viewed by a user's eye 90. These reticles may have a form of a circle, dots, scales, chevrons, crosshairs, or a combination of these. In some embodiments, this image may be a reticle, such as an outer reticle that lacks a center dot. A user's eye 90 may view the image of the reticle and a target (not shown) through holographic optical element 70. In alternatives, further optical elements may be provided, such as a collimating lens that collimates the light beam. Further alternatives may remove elements such that the light beam path is more direct than illustrated, or may add or change elements to provide different paths, with or without collimation.

Any embodiment of this invention may also have a non-diffraction element (NDE), which may consist of a partial mirror, glass or dichroic film coating. As used herein, an NDE is defined as an optical element for redirecting a pattern of light while preserving wavefront and diffracted pattern characteristics. As such, an NDE is not an HOE. For example, in FIG. 5, the element 70 may represent an NDE while the element 60 represents an HOE. When the HOE reconstructs the image of a reticle, this image may be reflected in or by the NDE. Thus, the NDE may serve two functions for a sight. The NDE reflects the image such that it may be viewed by a user's eye. Additionally, a user may view a target through the same NDE such that the reticle is superimposed on the target. This facilitates a user for aiming the weapon or optical device. Therefore, a user views the reticle and the target through the NDE, not through an HOE. The NDE reflects more light and avoids a rainbow effect. It is noted that the mirrors that may be used in the illustrated embodiment would also be considered an NDE.

Figure 6:
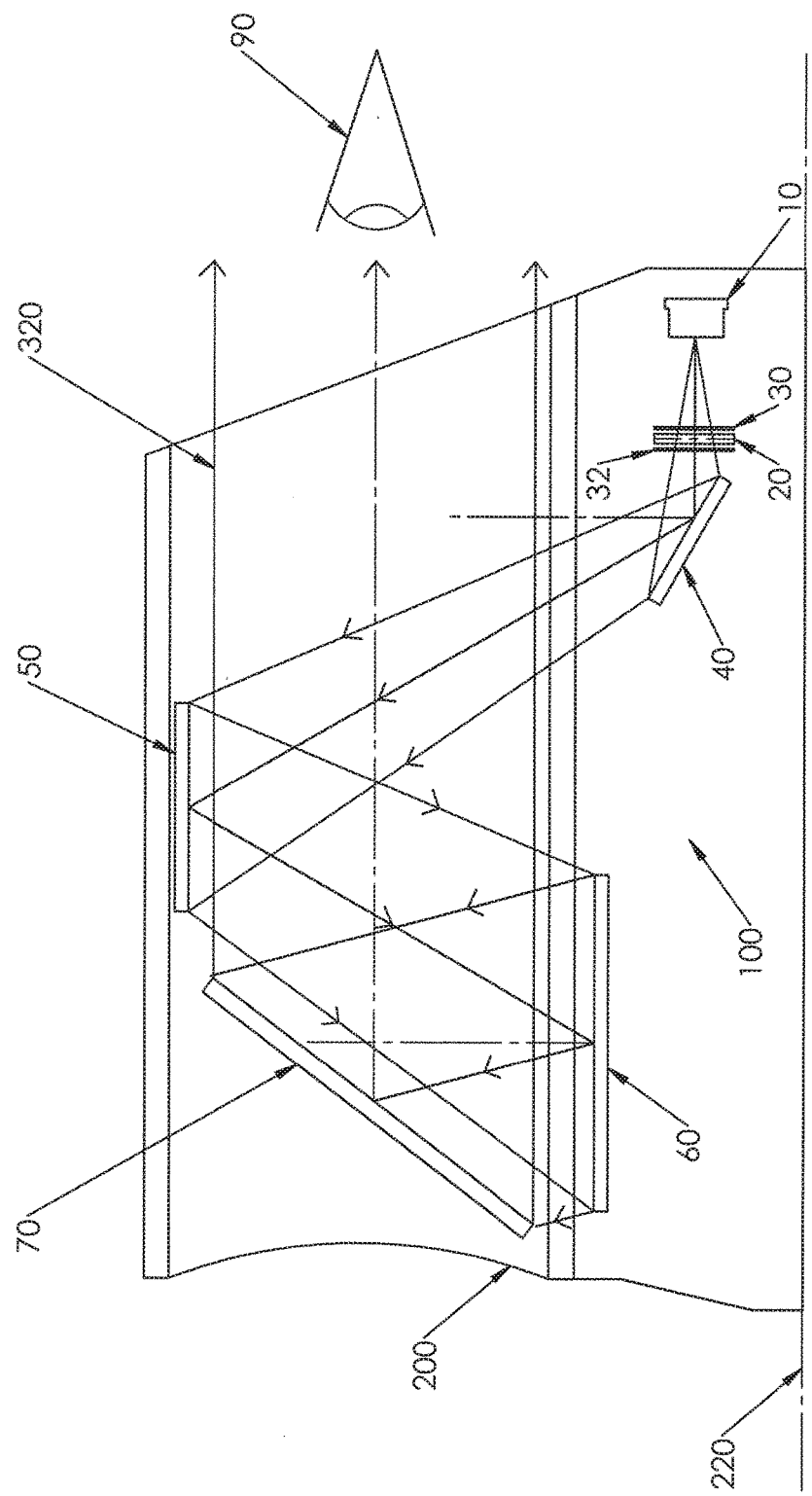
FIG. 6 is a light path diagram illustrating the path of a light beam in a sight according to an embodiment of the present invention.

FIG. 6 provides the arrangement discussed above in FIG. 5 housed in gunsight housing 200, which may be attached to weapon 220.

As will be clear to those of skill in the art, the herein described embodiments of the present invention may be altered in various ways without departing from the scope or teaching of the present invention. For example, the various optical elements may be arranged different than shown while still serving to illuminate an HOE and reconstruct a reticle. It is the following claims, including all equivalents, which define the scope of the invention.

The invention claimed is:

1. A holographic weapon sight comprising:
   a housing having a viewing end and an opposing target end, a viewing path being defined from the viewing end to the target end;
   a laser diode operable to project a light beam along a path when energized;
   a power source operable to energize the laser diode;
   a power controller in communication with the power source, the power controller operable to control an output of the power source to adjust a brightness of the light beam projected by the laser diode;
   a liquid crystal cell module at least partially disposed in the path of the light beam and operable to selectively attenuate the light beam to further adjust the brightness of the light beam, the liquid crystal cell module comprising:
      a liquid crystal controller, a liquid crystal cell, and a polarizer, the liquid crystal controller communicating with the liquid crystal cell;
      the liquid crystal cell being disposed in the path of the light beam such that the light beam from the laser diode illuminates the liquid crystal cell, the liquid crystal cell being operable to selectively rotate the light beam at an angle as the light beam passes therethrough;
      the polarizer being disposed in the path of the beam of light after the liquid crystal cell such that the polarizer is illuminated by the light beam after it passes through the liquid crystal cell, the polarizer polarizing the light beam; and
   a holographic optical element (HOE) illuminated by the polarized light beam after the liquid crystal cell module, the HOE reconstructing the light beam as an image of a reticle;
   wherein the power controller and the liquid crystal controller cooperate to selectively control the brightness of the light beam illuminating the HOE, thereby adjusting a brightness of the image of the reticle viewed by the user.

2. The holographic sight of claim 1, wherein no polarizer is disposed between the laser diode and the liquid crystal cell.

3. The holographic sight of claim 1, wherein the liquid crystal cell module further comprises an additional polarizer disposed in the light path between the laser diode and the liquid crystal cell.

4. The holographic sight of claim 3, wherein the polarizer and additional polarizer are each adjacent to the liquid crystal cell such that the liquid crystal cell is sandwiched between the polarizes.

5. The holographic sight of claim 3, wherein the polarizer and additional polarizer each have a polarization axis, the axes being generally aligned.

6. The holographic gun sight of claim 3, further comprising a third polarizer, the third polarizer being disposed in the path of the light beam.

7. The holographic sight of claim 1, wherein the laser diode is a vertical-cavity surface-emitting laser diode (VCSEL).

8. The holographic gun sight of claim 1, wherein the power controller controls the power source such that the output of the power source is a pulse width modulated signal, the power controller varying a pulse width and/or a pulse frequency of the pulse width modulated signal output by the power source and energizing the laser diode.

9. The holographic gun sight of claim 8, wherein the output of the power source has a pulse frequency of greater than or equal to 70 Hz.

10. The holographic gun sight of claim 1, wherein the light beam illuminating the HOE is a non-collimated diverging beam of light.

11. The holographic sight of claim 1, wherein the HOE is disposed in the viewing path such that a user views the image of the reticle through the HOE when viewing a target along the viewing path.

12. The holographic sight of claim 1, further comprising at least one non-diffraction element (NDE).

13. The holographic sight of claim 12, wherein the NDE is disposed in the viewing path and reflects an image of a reticle from the HOE, the HOE not being disposed in the viewing path.

14. A method for adjusting a brightness of an image of a reticle of a holographic weapon sight comprising:
   providing a weapon sight of claim 1;
   energizing the laser diode with the power source to project a light beam;
   controlling the output of the power source using the power controller to adjust the brightness of the light beam;
   further attenuating the light beam by using the liquid crystal cell module, wherein attenuating the light beam comprises:
     projecting the light beam on the liquid crystal cell and using the liquid crystal controller to selectively rotate the light beam at an angle; and
     projecting the light beam from the liquid crystal cell onto the polarizer and polarizing the light beam when the light beam is passing through the polarizer in order to adjust the brightness of the light beam;
   illuminating the HOE with the light beam from the polarizer, the HOE reconstructing the light beam as an image of a reticle; and
   cooperatively controlling the power controller and the liquid crystal controller to control the brightness of the light beam thereby adjusting the brightness of the image of the reticle.

\* \* \* \* \*